(12) United States Patent
Edwards et al.

(10) Patent No.: US 7,425,843 B1
(45) Date of Patent: Sep. 16, 2008

(54) PROGRAMMABLE LOGIC DEVICE MULTI-BOOT STATE MACHINE FOR SERIAL PERIPHERAL INTERFACE (SPI) PROGRAMMABLE READ ONLY MEMORY (PROM)

(75) Inventors: Eric E. Edwards, Albuquerque, NM (US); Wayne E. Wennekamp, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/890,822

(22) Filed: Aug. 7, 2007

(51) Int. Cl.
*H03K 19/173* (2006.01)
(52) U.S. Cl. .......................... 326/38; 326/47
(58) Field of Classification Search ............. 326/37–41, 326/47
See application file for complete search history.

(56) References Cited

U.S. PATENT DOCUMENTS 7,281,082 B1 * 10/2007 Knapp ........................ 711/103
7,301,822 B1 * 11/2007 Walstrum et al. ............. 326/37

OTHER PUBLICATIONS

U.S. Appl. No. 11/131,751, filed May 18, 2005; James A. Walstrum, Jr. et al., entitled "Multi-Boot Configuration of Programmable Devices", Xilinx, Inc. 2100 Logic Drive, San Jose, CA, 36 pages.
U.S. Appl. No. 11/131,764, filed May 18, 2005; James A. Walstrum, Jr. et al., entitled "Parellel Interface for Configuring Programmable Devices", Xilinx, Inc. 2100 Logic Drive, San Jose, CA, 36 pages.

* cited by examiner

*Primary Examiner*—James H Cho
(74) *Attorney, Agent, or Firm*—Thomas A. Ward

(57) ABSTRACT

Multiple configurations are provided for a programmable logic device (PLD), such as a field programmable gate array (FPGA), when connected to a serial peripheral interface programmable read only memory (SPI PROM) by using a programmable SPI address register incorporated into a SPI state machine of the PLD. A read command followed by a first address corresponding to first configuration data is sent from the SPI address register of the SPI state machine of the PLD to the SPI PROM. Data starting at the first address in the SPI PROM is then read by the PLD from the SPI PROM along with a second address corresponding to second configuration data. The first configuration data is stored in the PLD memory, and the second address is stored in the SPI address register. These steps may be repeated for subsequent boots of the PLD for additional configurations of the PLD.

18 Claims, 4 Drawing Sheets

PROGRAMMABLE LOGIC DEVICE MULTI-BOOT STATE MACHINE FOR SERIAL PERIPHERAL INTERFACE (SPI) PROGRAMMABLE READ ONLY MEMORY (PROM)

BACKGROUND

1. Technical Field

The present invention relates generally to Programmable Logic Devices (PLDs). More particularly, the present invention relates to connection of a Serial Peripheral Interface (SPI) to a PLD.

2. Related Art

Programmable. Logic Devices (PLDs) exist as well-known types of integrated circuits (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

A FPGA can be used with a serial peripheral interface programmable read-only memory (SPI PROM), a permanent memory chip in which the content for programming the FPGA is created by a user of the FPGA chip. In order to configure the FPGA, contents of the SPI PROM are loaded into the FPGA configuration memory.

It would be desirable to provide processes to optimize the data transfer between a FPGA and a SPI PROM.

SUMMARY

Embodiments of the present invention optimize the link between a FPGA and a SPI PROM by enabling multiple configurations of a PLD, such as a FPGA, to be provided from a single SPI PROM. The multiple configurations are loaded when the PLD is connected to a SPI PROM using a programmable SPI address register incorporated into a SPI state machine of the PLD. With the SPI state machine, a read command followed by a first address where configuration data is to be retrieved is sent from the SPI address register of the PLD to the SPI PROM. Configuration data starting at the first address in the SPI PROM is then read by the PLD from the SPI PROM along with a second address where additional second configuration data is stored in the SPI PROM. The data read is stored in the PLD memory, and the second address where additional data is to be read is stored in the SPI address register. These steps may be repeated to retrieve the second configuration data as well as other configurations for subsequent boots of the PLD, with the second address providing the start address for locating the next configuration in the SPI PROM.

BRIEF DESCRIPTION OF THE DRAWINGS

Further details of the present invention are explained with the help of the attached drawings in which.

DETAILED DESCRIPTION

Although the exemplary device described herein is a FPGA, a number of different types of devices can be used, including PLAs and CPLDs. The following description herein will refer to a FPGA for convenience.

Figure 1:
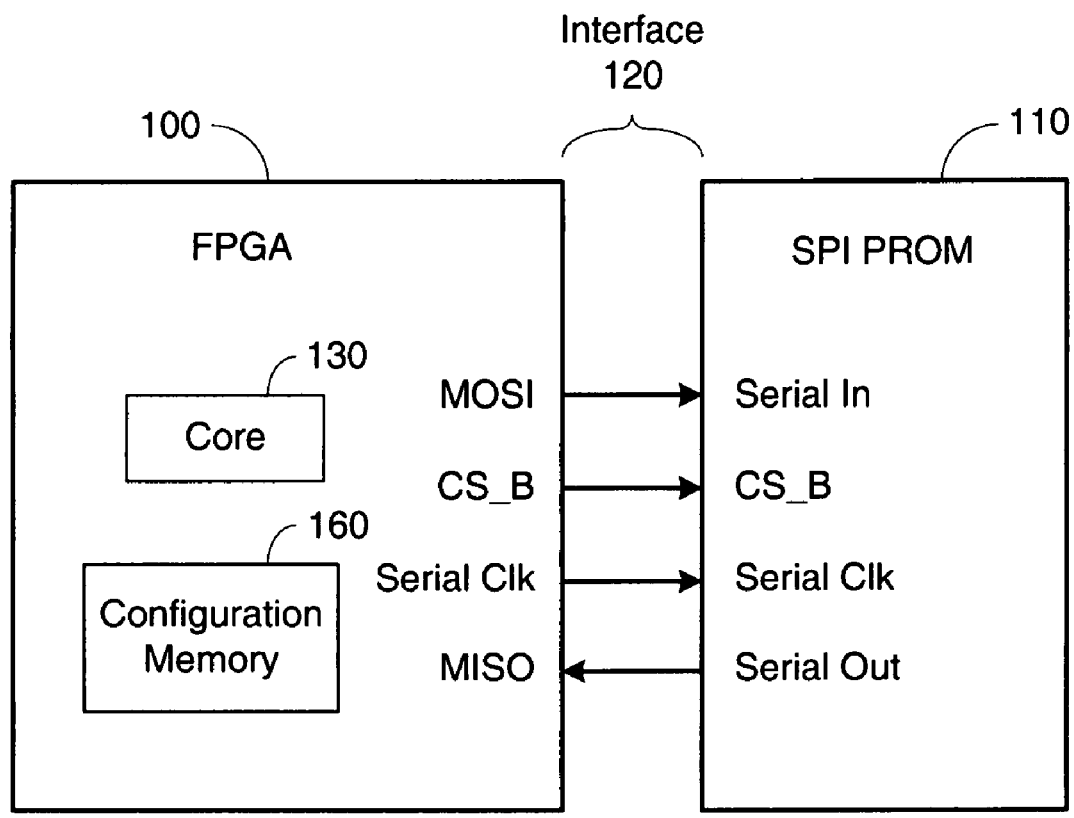
FIG. 1 illustrates exemplary FPGA and SPI PROM connections.

FIG. 1 illustrates exemplary FPGA and SPI PROM connections. FPGA 100 sends commands to the SPI PROM 110 via a four wire interface 120. Specifically, the output of "Master Out Slave In" of FPGA 100, shown as MOSI, is the input to "Serial In" of SPI PROM 110. The output "Serial Out" of the SPI PROM is the input to "Master In Slave Out" of the FPGA, shown as MISO. Data is provided serially between the MOSI/Serial In and MISO/Serial Out connections.

FPGA 100 sends control signals on the chip select bar of the FPGA, shown as CS_B (_B indicating select is active low). The chip select signal CS_B is synchronized with the serial clock of the FPGA, shown as "Serial Clk." The output of the serial clock of the FPGA is the input of the serial clock of the SPI PROM, shown as "Serial Clk." The signals making up Interface 120 are used for configuration purposes. To configure the FPGA, the FPGA sends data such as a "read" command to the SPI PROM on MOSI, and the SPI PROM sends data to the FPGA on MISO to load the contents of the SPI PROM into the FPGA configuration memory.

The FPGA 100 of FIG. 1 typically includes a core 130 and a configuration memory 160. A core is a large general purpose logic function used as a building block in chip design, the core sometimes being a microprocessor or microcontroller. The configuration memory 160 stores data for programming the logic of the FPGA so that the FPGA forms a desired component. Pull-up resistors (not shown) typically found at the interface 120 because the FPGA 100 and the SPI PROM 110 may operate with different power supply voltages.

Conventional FPGAs have not yet made use of this available SPI PROM 24-bit address functionality. Currently, when programming or configuring one FPGA with one SPI PROM, the FPGA is loaded with contents starting from the SPI PROM 24-bit address of all zeros.

Figure 2:
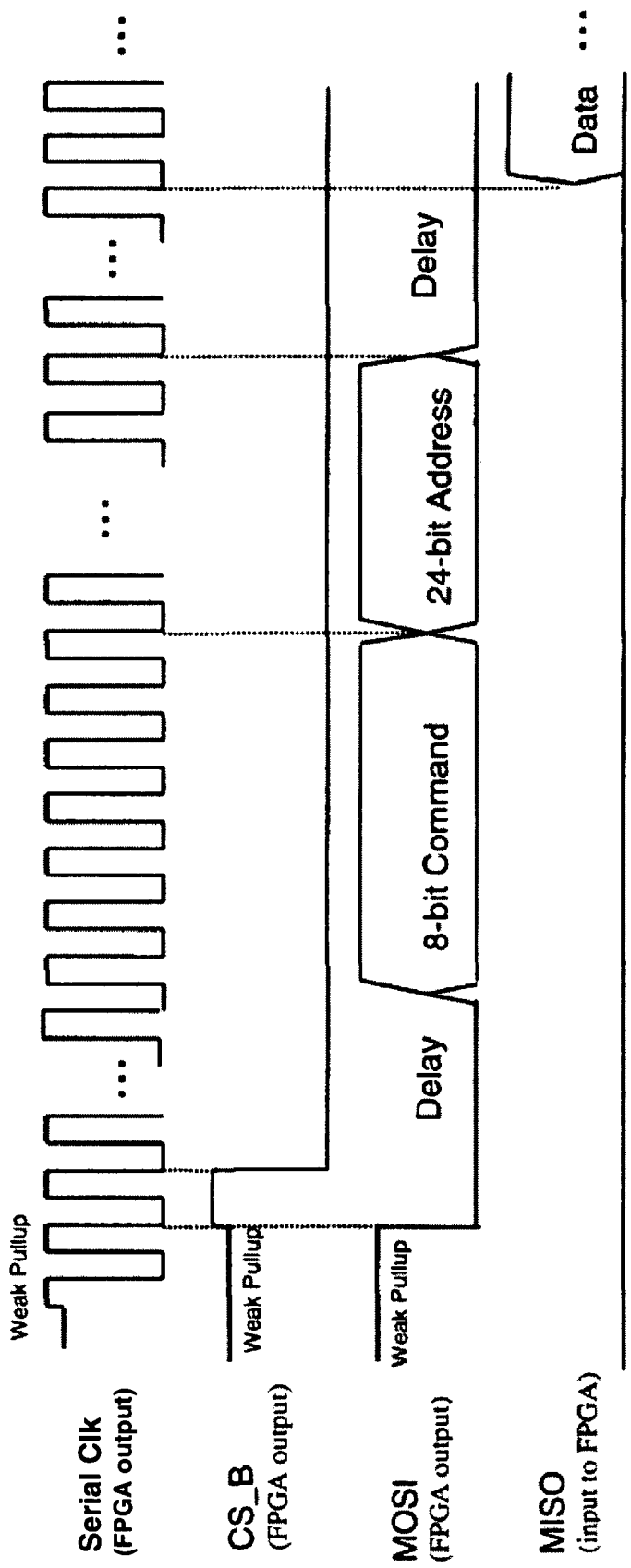
FIG. 2 illustrates exemplary FPGA and SPI PROM waveforms during FPGA configuration for the typical FPGA and SPI PROM connection of FIG. 1.

FIG. 2 illustrates exemplary FPGA and SPI PROM waveforms during FPGA configuration for the typical FPGA and SPI PROM connection of FIG. 1. For convenience, components carried over from FIG. 1 to FIG. 2 are similarly labeled. A weak pull-up voltage is shown on the three outputs of the FPGA in FIG. 2. Once the FPGA powers on, the FPGA outputs signals to the SPI PROM that are used to load the FPGA memory. The FPGA output signals include the serial clock on "Serial Clk," and the chip select CS_B, on which the FPGA selects the SPI PROM. The FPGA output signals also include an "8-bit command" output by the FPGA on MOSI after an initial "Delay" to assure synchronization. SPI PROMs allow for a 24-bit address to be immediately loaded after the 8-bit command. The 24-bit address is typically twenty-four bits of zeros and represents the starting address of data to be read within the SPI PROM. The "24-bit Address" on MOSI is followed by another "Delay." The SPI PROM then loads the "Data" on MISO to download the contents of the SPI PROM into FPGA memory.

Figure 3:
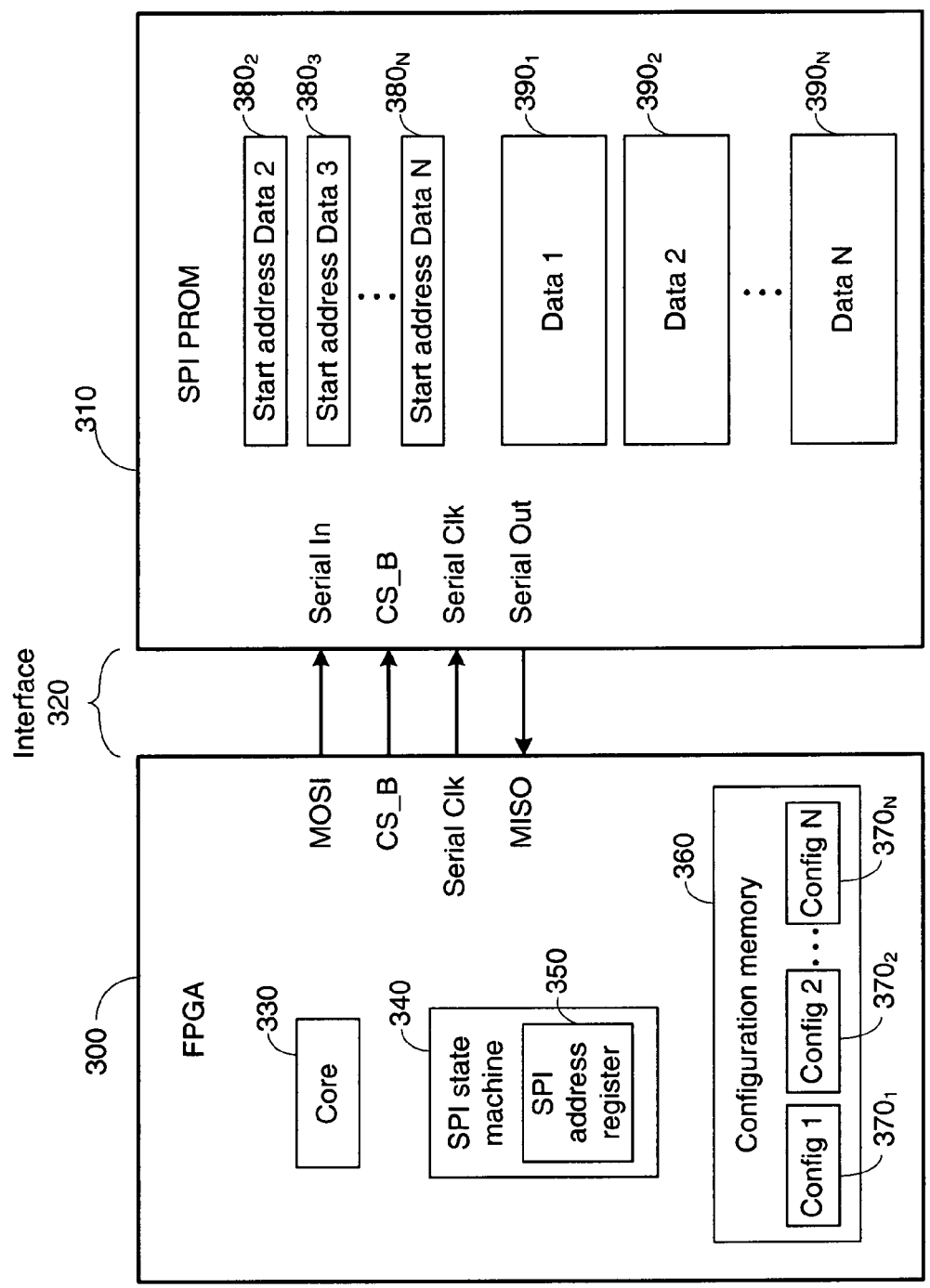
FIG. 3 illustrates FPGA and SPI PROM connections according to embodiments of the present invention.

FIG. 3 illustrates connection of a FPGA 300 and SPI PROM 310 according to embodiments of the present invention. Embodiments of the present invention incorporate a programmable address register 350 into a SPI state machine 340 in the FPGA 300. For configuration purposes, when loading the contents of a SPI PROM 310 into FPGA configuration memory 360, the FPGA 300 when powered up will output to SPI PROM 310 an 8-bit "read" command and a 24-bit programmable start address retrieved from the programmable address register 350 of the FPGA's SPI state machine 340. The SPI PROM 310 then outputs its data to the FPGA 300. The 24-bit programmable start address appended to the 8-bit read command will allow for multiple FPGA configurations, or "Config 1" through "Config N" $370_{1-N}$, to be loaded in FPGA 300 from the single SPI PROM 310 using embodiments of the present invention. An address of all zeros identifies the first configuration "Data 1" $390_1$, in the SPI PROM 310 similar to that stored in a conventional manner. Further, additional loadable start addresses "Start address Data 2" through "Start address Data N" $380_{2-N}$ are depicted in the SPI PROM 310 along with configuration "Data 2" through configuration "Data N" $390_{2-N}$. These addresses $380_{2-N}$ allow addressing and subsequent loading of the additional configurations Data 2 through Data N $390_{2-N}$ stored in the SPI PROM 310.

Figure 4:
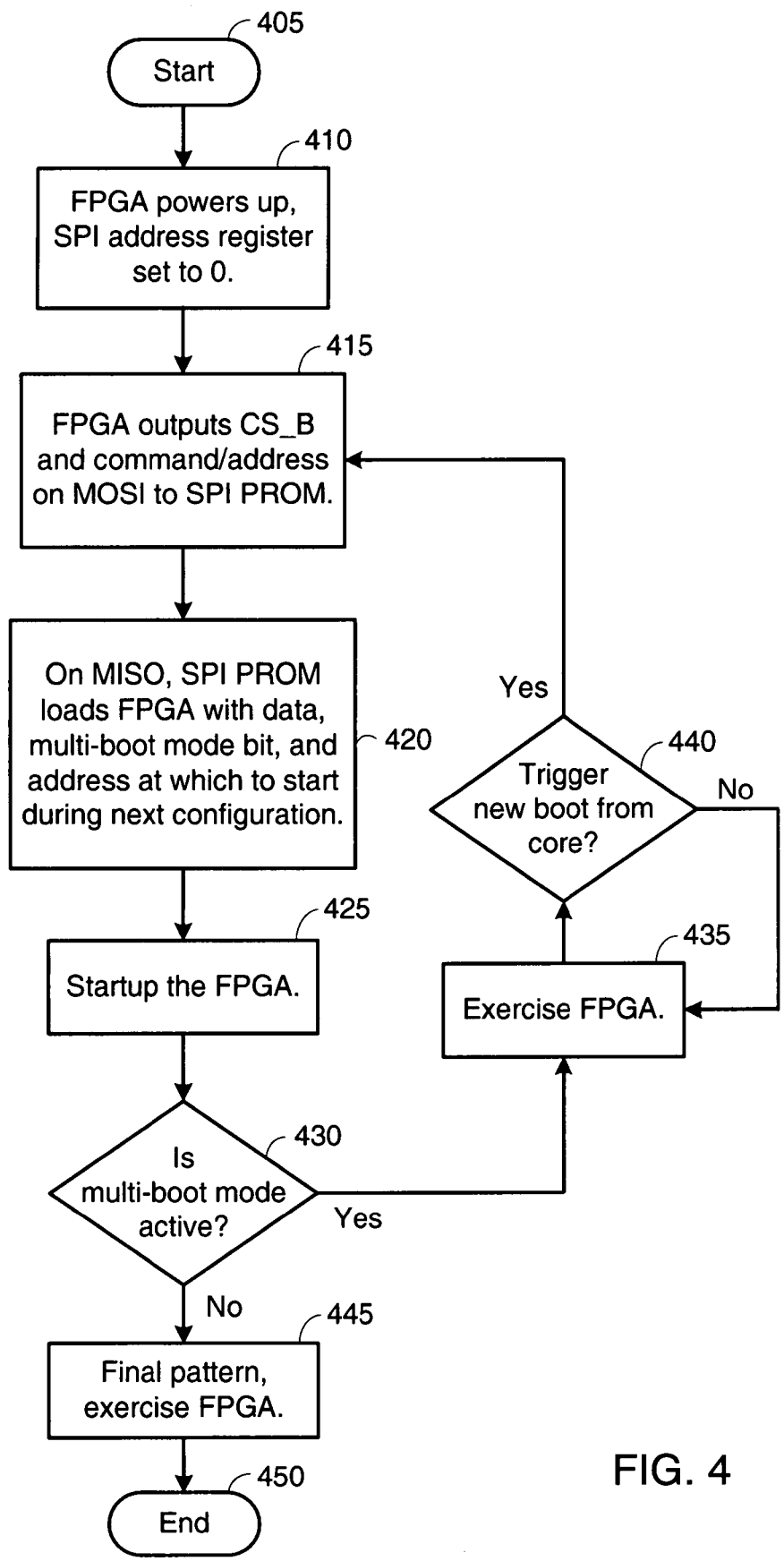
FIG. 4 depicts a flow chart showing an exemplary FPGA configuration process according to embodiments of the present invention.

FIG. 4 depicts a flow chart showing an exemplary FPGA configuration process according to embodiments of the present invention. FIG. 4 is used in conjunction with FIGS. 2 and 3. The FPGA configuration process begins in step 405. In step 410, the FPGA 300 powers up and the 24-bit SPI address register 350 that was incorporated into the SPI state machine 350 of the FPGA 300 is set to zero. In step 415, on the clock "Serial Clk" of interface 320, the SPI state machine 340 of the FPGA 300 instructs the FPGA 300 to output the chip select CS_B to select the SPI PROM 310. After a delay, the SPI state machine 340 of the FPGA 300 instructs the FPGA 300 to output an 8-bit command on MOSI, typically a "read" command. The SPI state machine 340 of the FPGA 300 will also instruct the FPGA to output the 24 bits of zeros from the SPI address register 350 on MOSI to the SPI PROM 310, followed by another delay. The 24 bits of zeros represent the first address for configuration Data 1 $390_1$ within the SPI PROM 310.

In step 420, the SPI PROM 310 outputs a functional pattern on MISO to load on the FPGA 300. The functional pattern includes Data 1 $390_1$ that starts at the first address of all zeros in the SPI PROM 310. The core 330 of the FPGA handles storing this data sent by the SPI PROM to a first configuration Config 1 $370_1$ in the FPGA memory. The functional pattern loaded into the FPGA 300 by the SPI PROM 310 also includes the 24-bit next starting address, or Start address Data 2 $380_2$, within the SPI PROM for the next configuration of the FPGA. This 24-bit address is stored in the SPI address register 350 of the FPGA's SPI state machine 340.

The functional pattern also includes a bit that turns on or off multi-boot mode, or capability, of the FPGA 300. The FPGA 300 decodes the functional pattern to turn on/off multi-boot mode. The multi-boot bit is routed to the FPGA core 330, or configuration controller, and allows the core to start the next configuration sequence of the FPGA. The multi-boot mode of the FPGA allows the loading of various multi-boot kernels using a single compliant boot loader. The multi-boot mode is turned on or off based on the configuration options the user feeds the FPGA's SPI state machine 340. A single SPI PROM can store multiple boot patterns, or Data 1 through Data N $390_{1-N}$, each boot pattern at a different address, including Start address Data 2 through Start address Data N $380_{2-N}$, within the SPI PROM 310. Each boot pattern in an SPI PROM can be used multiple times. Once the multi-boot mode is turned off, the 24-bit address identifying the start address of the next configuration in the SPI PROM previously sent to and stored by the FPGA is unneeded. The functional pattern for the multi-boot mode includes two or more multi-boot mode bits, such that the extra bit(s) is used for redundancy.

In step 425, the FPGA is started up from the first boot. If in step 430, the multi-boot mode is active, then in step 435, the FPGA is exercised with the last functional pattern from the SPI PROM 310 in normal user-mode. If in step 440 a new boot from the core is not triggered, the FPGA continues to be exercised in step 435 and additional configurations are not loaded. If in step 440, a new boot from the core is triggered, the process loops back to step 415. In step 415, the process enters the loop, and on the clock "Serial Clk," the SPI state machine of the FPGA instructs the FPGA to output the chip select CS_B to select the SPI PROM. After a delay, the SPI state machine of the FPGA instructs the FPGA to output an 8-bit read command on MOSI, as well as the pre-stored 24-bit starting address, now Start address Data 2 $380_2$, from the SPI address register 350 of the FPGA's SPI state machine 340 that was sent by the SPI PROM 310 on the previous iteration. In step 420, the process proceeds as described above for the first iteration of the loop. In step 425, the FPGA is started up from the new boot triggered from the core in step 440.

By allowing a 24-bit address to be programmed into the FPGA's SPI state machine 340, anytime the SPI PROM 310 is queried by the FPGA 300 the SPI PROM 310 accesses data starting at that new address. Because of this, every time the SPI PROM 310 is queried, it can be given a different address and so load the FPGA 300 with a completely different configuration pattern each time.

The process can be repeated as many times as desired by the programmer of the SPI PROM and the FPGA. If in step 430, the most recently loaded pattern has disabled the multi-boot mode, making the multi-boot mode no longer active, then in step 445, the FPGA is exercised with the last functional pattern from the SPI PROM. In step 450, the process ends.

In some embodiments, a programmable 8-bit command can be used, as opposed to the hard coded 8-bit command of the embodiments above. The programmable 8-bit command can be used in addition to the programmable 24-bit address register.

In some embodiments, SPI commands other than read can include, but are not limited to, programming, erasing, or getting the idcode for the SPI PROM.

In some embodiments, the 24-bit address allows for any number of FPGA configurations from a single SPI PROM. The 24-bit address also allows for any number of FPGA configurations from multiple SPI PROMs, using a decode external to the FPGA of the most significant bits (MSBs) as SPI PROM chip selects. The FPGA configurations from multiple SPI PROMS can be read using multiple address registers, multiple CS_B pins, or the user could direct the CS_B signal to different SPI PROMs on the user's board as needed.

In some embodiments, instead of turning off the multi-boot mode in step 420, the user can leave multi-boot mode on in step 420 but choose not to exercise the FPGA at any point.

The SPI PROM can be located external to the FPGA or internal to the FPGA. Some PLDs are a combination of a FPGA and a SPI PROM stacked inside of the same package.

Although the present invention has been described above with particularity, this was merely to teach one of ordinary skill in the art how to make and use the invention. For example, although 8-bit commands and 24-bit addresses are used in the descriptions of embodiments herein, a person of ordinary skill in the art could use other length commands and addresses. Many additional modifications will fall within the scope of the invention, as that scope is defined by the following claims.

What is claimed is:

1. A method to enable providing multiple configurations to a programmable logic device (PLD) from a serial peripheral interface programmable read-only memory (SPI PROM), the method comprising:
   sending by the PLD to the SPI PROM a command followed by a first address identifying a start of a first configuration in the SPI PROM as provided from a SPI address register incorporated into a state machine of the PLD;
   receiving by the PLD from the SPI PROM data starting at the first address in the SPI PROM, and receiving a second address identifying a start of second configuration data in response to the command; and
   storing the first configuration data in a memory of the PLD and storing the second address in the SPI address register of the PLD.

2. The method of claim 1, further comprising
   sending by the PLD to the SPI PROM a read command followed by the second address as provided from a SPI address register incorporated into the state machine of the PLD;
   receiving by the PLD from the SPI PROM the second configuration data starting at the second address in the SPI PROM, and receiving a third address identifying a start of a third configuration in the SPI PROM; and
   storing the second data in a memory of the PLD and storing the third address in the SPI address register of the PLD.

3. The method of claim 2, further comprising reading additional configuration data and start addresses for the additional configuration data from the SPI PROM into the PLD until all configurations stored in the SPI PROM are read.

4. The method of claim 1, further comprising reading the second configuration data stored at the second address from a second SPI PROM into the PLD.

5. The method of claim 1, wherein sending further comprises sending a multi-boot enable bit to the PLD that turns on a multi-boot mode to indicate to the PLD to read multiple configurations from the SPI PROM.

6. The method of claim 5, wherein after the multiple configurations are read into the PLD are complete, the method further comprises sending a multi-boot disable bit to the PLD that turns off the multi-boot mode.

7. The method of claim 1, further comprising initializing the bits of the SPI address register to zeros prior to the step of sending the first address.

8. The method of claim 1, wherein the command comprises one of read, write, erase, program, and idcode.

9. The method of claim 1, wherein the PLD comprises a Field Programmable Gate Array (FPGA).

10. A system comprising:
    a serial peripheral interface programmable read-only memory (SPI PROM); and
    a programmable logic device (PLD) comprising:
       a state machine storing a first configuration, a second configuration, and a second address identifying the start location of the second configuration: and
       a SPI address register incorporated into the state machine,
    wherein the SPI address register is adapted to store a first command and a first address for sending from the state machine of the PLD to the SPI PROM to read the first configuration from the SPI PROM, and
    wherein after the first read command and first address are sent from the SPI address register, the PLD is adapted to receive and store the second address in the SPI address register identifying where a second configuration data is stored in the SPI PROM.

11. The system of claim 10,
    wherein the state machine is further adapted to provide a second read command and the second address to the SPI PROM after another boot of the PLD, and
    wherein the PLD is adapted to receive and store the second configuration, and to receive and store a third address in the SPI address register identifying where a third configuration data is stored in the SPI PROM.

12. The system of claim 10, wherein the PLD is adapted to concurrently store multiple configurations provided from multiple SPI PROMs.

13. The system of claim 10, further comprising a multi-boot bit provided in the PLD that enables turn on of a PLD multi-boot mode to cause the PLD to load the first configuration and the second configuration.

14. The system of claim 13, wherein when the multiple configurations are stored by the FPGA, the multi-boot bit is adapted to be toggled to turn off the PLD multi-boot mode.

15. The system of claim 10, wherein the PLD is adapted to initialize the SPI address register to store all zeros before the first read command and the first address are sent from the PLD to the SPI PROM.

16. The system of claim 10, wherein the first command comprises one of read, write, erase, program, and idcode of SPI PROM.

17. The system of claim 10, wherein the PLD comprises a field programmable gate array (FPGA).

18. A Field Programmable Gate Array (FPGA) comprising:
    a state machine connected to a serial port from the FPGA for connecting to a serial memory for providing instructions to the serial memory;
    an address register provided in the state machine; and
    a memory provided in the FPGA;
    wherein the state machine is adapted to provide a first command to read a first configuration data from the serial memory, and to provide a first address from the address register to identify where the first configuration data is located to the serial memory when a boot command is provided to the FPGA, and
    wherein the memory is connected to receive and to store the first configuration data from the serial memory, and
    wherein the address register is adapted to receive and store a second address in the SPI address register identifying where a second configuration is stored in the serial memory.

* * * * *